United States Patent [19]

Neri

[11] Patent Number: 4,691,970

[45] Date of Patent: Sep. 8, 1987

[54] DUSTPROOF CABINET, IN PARTICULAR FOR ELECTRICAL EQUIPMENT

[76] Inventor: Armando Neri, Via Napoli 7, 40139, Bolonga, Italy

[21] Appl. No.: 848,475

[22] Filed: Apr. 7, 1986

[30] Foreign Application Priority Data

Apr. 12, 1985 [IT] Italy .................................. 4851/85[U]

[51] Int. Cl.[4] .......................... A47F 3/00; A47B 96/00
[52] U.S. Cl. .............................. 312/257 SK; 312/140; 312/263
[58] Field of Search ................. 312/257 SK, 140, 111, 312/304, 263

[56] References Cited

U.S. PATENT DOCUMENTS

| | | | |
|---|---|---|---|
| 2,028,058 | 1/1936 | Geyer | 312/140 |
| 2,732,273 | 1/1956 | Schaffner | 312/257 SK |
| 3,044,656 | 7/1962 | Combs et al. | 312/257 SK |
| 3,346,310 | 10/1967 | Diack | 312/140 |
| 3,380,768 | 4/1968 | Wolfensberger | 312/140 |
| 3,945,743 | 3/1976 | Koch | 312/257 SK |
| 4,105,348 | 8/1978 | Anderson et al. | 312/140 |
| 4,171,150 | 10/1979 | Söderlund | 312/263 |
| 4,468,067 | 8/1984 | Jenkins | 312/140 |

FOREIGN PATENT DOCUMENTS

| | | | |
|---|---|---|---|
| 1130359 | 8/1982 | Canada | 312/257 SK |
| 640975 | 6/1962 | Italy | 312/257 SK |

Primary Examiner—Victor N. Sakran
Attorney, Agent, or Firm—Cushman, Darby & Cushman

[57] ABSTRACT

The dustproof cabinet disclosed features a lattice framework in which a plurality of members are interconnected via their ends in sets of three, at least, by way of modular joints which, together with the members, create frames around the external openings of the lattice; each opening is then enclosed closed by a dustproof panel. The joints exhibit ribs or channels which, together with similar ribs or channels incorporated into the members, provide each frame with the mounting for a seal that occupies the entire periphery of the relative frame and offers a frontal abutment to the panel covering the relative opening.

11 Claims, 13 Drawing Figures

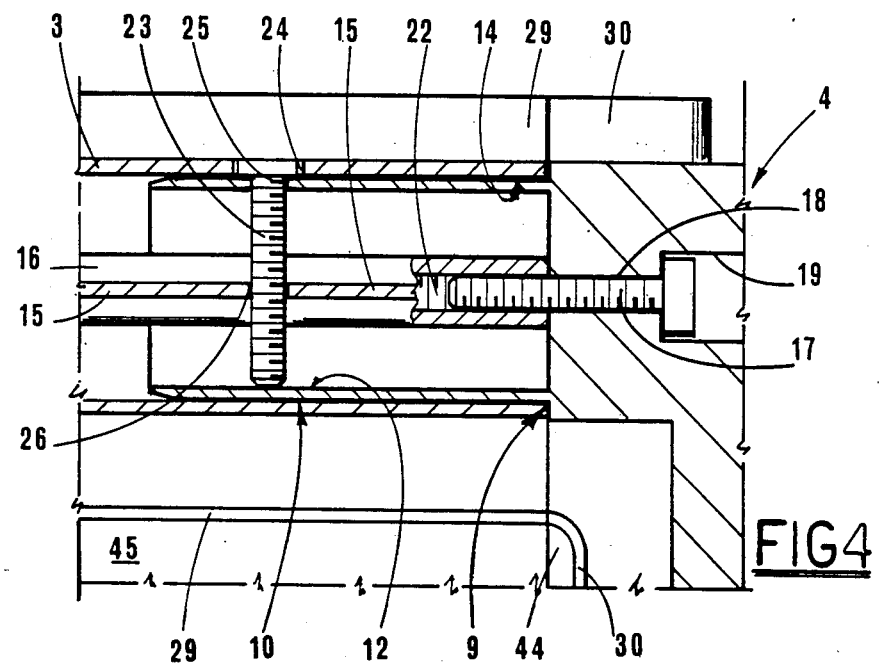

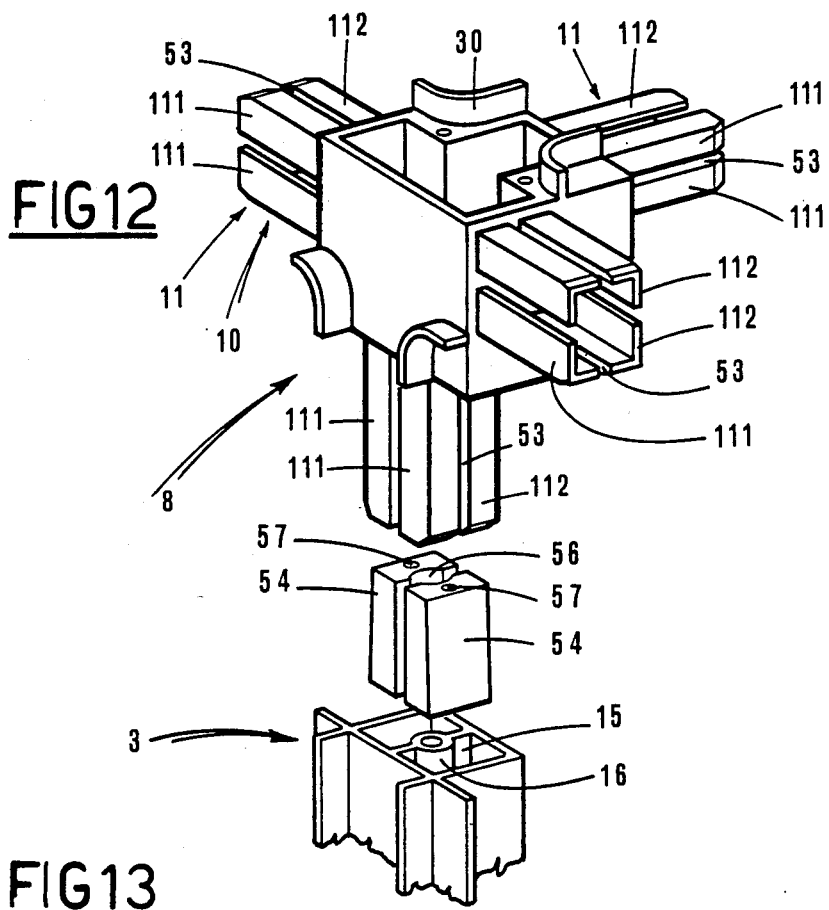
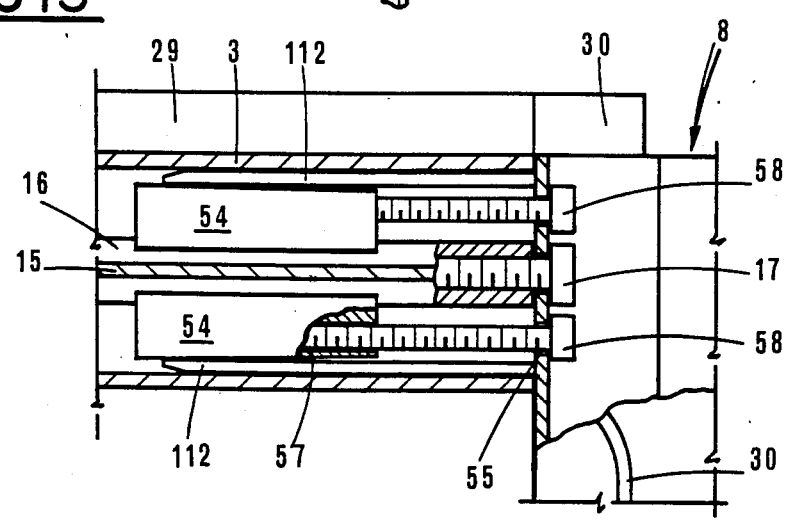

DUSTPROOF CABINET, IN PARTICULAR FOR ELECTRICAL EQUIPMENT

BACKGROUND OF THE INVENTION

The invention relates to a dustproof cabinet, in particular for housing electrical equipment.

Conventionally, numerous machine tools and power handling machines are controlled and driven by way of electrical or electronic equipment housed in cabinets located alongside. Being sited in the same environment as the power machines, such cabinets are subject to the effects of dust, and of all the other polluting agents generally characteristic of a work environment, and must therefore be able to afford adequate protection to the delicate devices they enclose, in the face of such pollution.

Moreover, cabinets of the type must permit of easy dismantling and re-assembly in order to enable both routine servicing of the devices they contain, and where necessary, rearrangement of the cabinets themselves, as dictated by modifications either to the machines and/or to the systems with which they are associated.

The object of the invention described herein is that of embodying a cabinet, utilizing modular construction, which can respond to the requirements outlined above in simple and economical fashion.

SUMMARY OF THE INVENTION

The stated object is realized with the invention as described herein, inasmuch as it relates to a dustproof cabinet, intended for electrical equipment in particular, comprising a lattice framework of substantially parallelepiped shape which creates a plurality of outward-facing openings each exhibiting the shape of a parallelogram, and a plurality of panels constituting the sides of the cabinet, each such panel being disposed such as to enclose one relative opening. The framework features a plurality of joints, and a plurality of members which flank the openings and are interconnected at the joints so as to form frames around the openings, each joint being disposed at the vertex of at least three such openings, interconnecting at least three members, and comprising respective means of connection and fasteners for each member that can be readily detached and removed. Each frame offers a peripheral frontal abutment to a respective panel consisting in dustproof sealing means, lodged between the panel and the relative frame, which engage the entire periphery of a single panel, and in a mounting that extends in unbroken fashion around the members and joints making up each frame, thereby affording support to the sealing means substantially through their entire length, when offered frontally to the relative panel.

BRIEF DESCRIPTION OF THE DRAWINGS

The invention will now be described in detail by way of example, with reference to the accompanying drawings, in which:

FIG. 3 is the perspective of a second detail of FIG. 1;

FIG. 4 is the axial section through a detail of FIGS. 2 and 3;

FIG. 5 is the section through V—V in FIG. 1;

FIGS. 6 . . . 9 are four variations on the cross-section illustrated in FIG. 5;

FIG. 11 is a section similar to that through V—V, which relates to the variation of FIG. 10;

FIG. 12 is the perspective of a variation on the detail of FIG. 3;

FIG. 13 is the axial section through a detail of FIG. 12.

DESCRIPTION OF THE PREFERRED EMBODIMENTS

Figure 1:
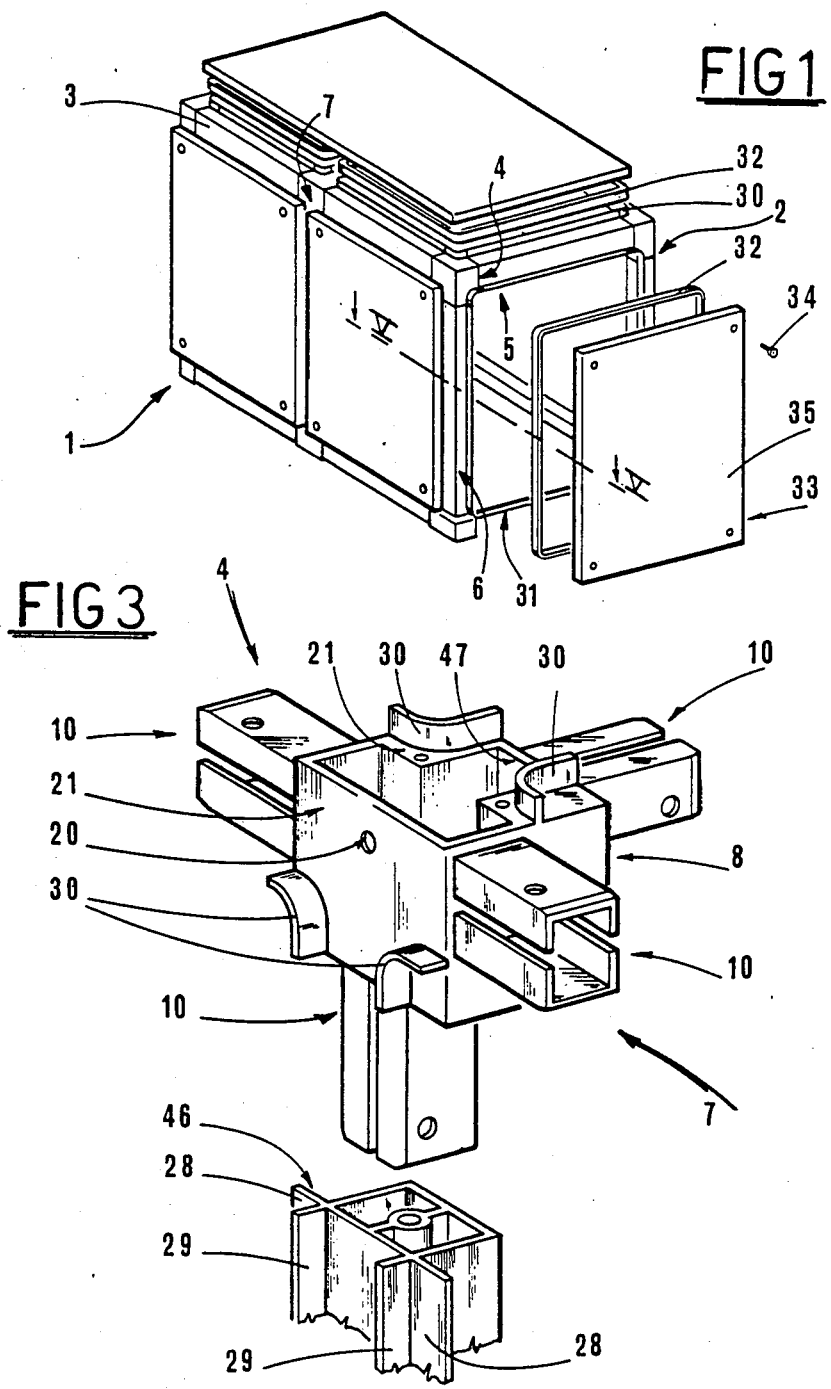
FIG. 1 is the perspective of a cabinet embodied in accordance with the invention, partly exploded, with certain parts omitted in the interests of clarity.

In FIG. 1, 1 denotes the assembled dustproof cabinet, which comprises a lattice framework 2 of substantially parallelepiped shape, consisting of a plurality of members 3, and a plurality of corner joints 4 which are located at the vertexes of the parallelepiped and interconnect the adjacent ends of the three members 3 converging on the single corner.

The framework 2 creates at least one opening 5 in each side of the cabinet 1, which is surrounded by a frame 6 exhibiting the shape of a parallelogram, substantially, and comprising four members 3, set at right angles one to the next and interconnected by four corner joints. Each of the four joints 4 is located at the vertex common to three openings 5, one joint interconnecting three members, in the case of a frame 6 occupying an entire side of the cabinet 1; in cases where the framework 2 creates a number of adjacent and coplanar openings 5 per given side of the cabinet, use is made of intermediate joints 7 located at the vertex common to four openings, each one interconnecting the adjacent ends of four members 4.

Figure 2:
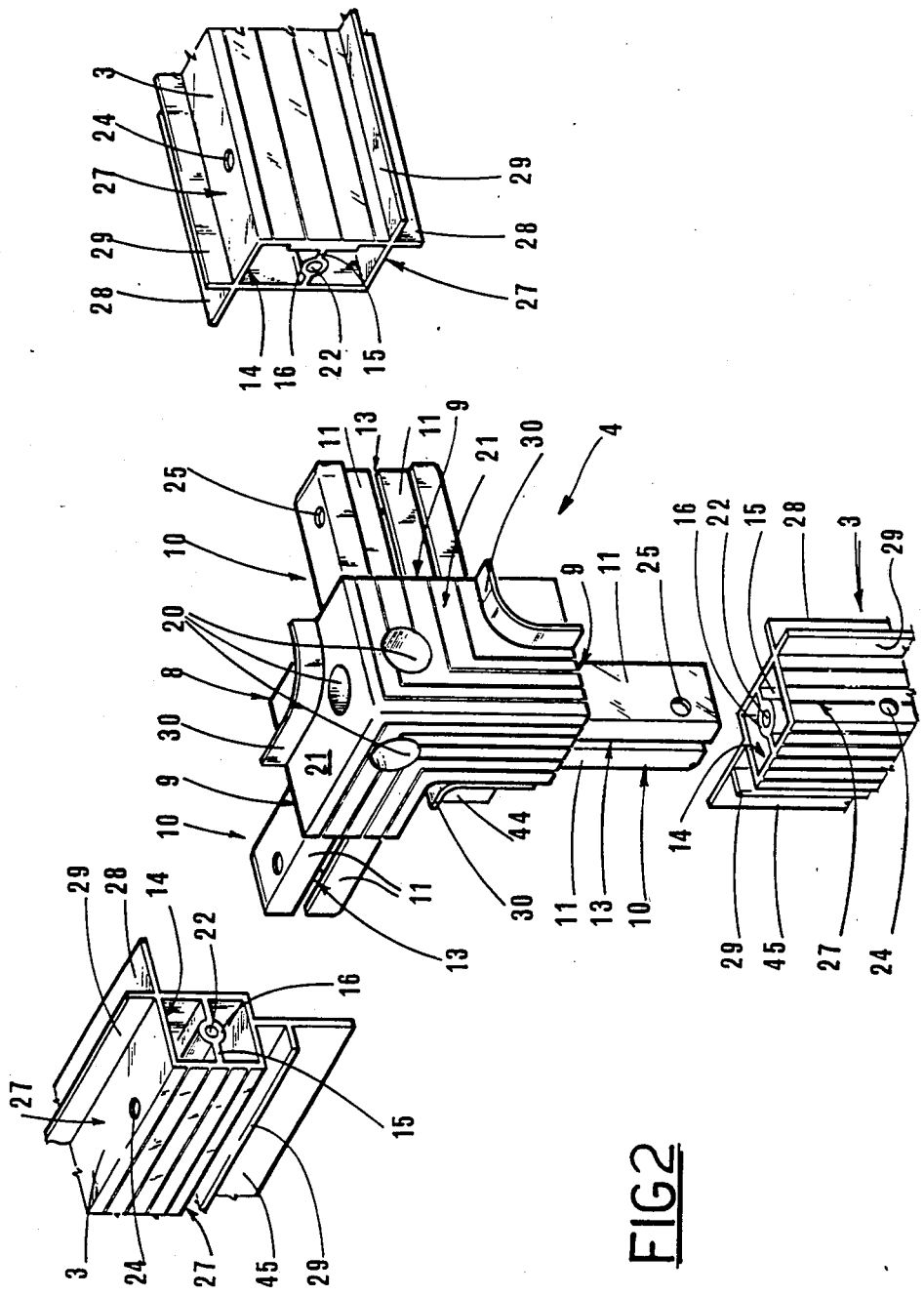
FIG. 2 is the exploded perspective of a first detail of FIG. 1.

In FIG. 2, each corner joint 4 will be seen to comprise a central block 8 substantially exhibiting the shape of a rectangular parallelpiped with three mutually perpendicular surfaces 9, each of which is provided with a relative means of connection in the form of an appendage 10 projecting perpendicularly from the relative surface 9.

As FIGS. 2 and 4 will show, each appendage 10 exhibits substantially parallelogram shape when seen in section, and consists of a pair of plugs 11 each exhibiting a substantially U-shaped cross section. The two plugs 11 are arranged with hollow sides facing one another in order to create a central axial passage 12 in the appendage 10 which, in addition to being open at the projecting end, thus remains similarly open at either side due to the creation of two slots 13 that separate the two plugs 11.

It will be observed from FIG. 2 that each member 3 exhibits parallelogram shape, substantially, when seen in section, and is provided with an axial passage 14, each end of which comprises a stretch designed to accommodate a relative appendage 10; the member is thus hollow, and moreover, is divided into two substantially equal parts by a central axial web 15, this in turn incorporating a central axial bead 16 of substantially cylindrical shape.

The end of each member 3 is joined with a relative appendage 10 by insertion of the appendage into the passage 14 such that the web 15 engages in the slots 13 (see FIG. 4). Each member 3 is then made axially stable in relation to the relative central block 8 by a fastener, which in FIG. 4 takes the form of a screw 17 that passes through a hole 18 provided in the relative surface, departing from a recess 19 in the block 8 and disposed coaxially with the relative appendage 10, such that its threaded end may engage in a stopped hole 22 located in the bead 16 of the relative member 3. Access is gained to each such screw 17 with a suitable tool (not illustrated) by way of a hole 20 located in the outer surface 21 of the block 8 opposite the connected surface 9.

Still referring to FIG. 4, fastening of each member 3 to the relative appendage 10 is made complete by forcing the plugs 11 apart inside the passage 14, employing spreading means 23 that consist of a transverse screw which occupies a through hole 24 located in the member 3, a threaded hole 25 coaxial with the through hole 24, located in one of the plugs 11, and a through hole 26 coaxial with holes 24 and 25, located in the web 15; the tip of such means duly exerts pressure on the inner surface of the plug 11 opposite the surface of the plug incorporating the threaded hole 25.

As FIG. 2 illustrates, each member 3 exhibits two opposed lateral surfaces 27, disposed parallel with respective surfaces 21 of the block 8 and integral with respective longitudinal fins 28 which project from the member 3. A mounting component in the form of a straight, longitudinal rib 29 projects outwards from each surface 27; each such rib interconnects with the corresponding rib 29 of an adjacent member 3 of the same frame 6 by way of a further mounting component consisting of a contoured rib 30 which exhibits a relatively wide radius of curvature and projects outwards from the respective surface 21 of the joint. The assembly of projecting ribs 29 and 30 offered thus by the frontal surface of each frame provides an unbroken, peripheral mounting 31 against which to locate dust-proof sealing means, taking the form of a seal 32, that interact frontally with the single panel 33 covering the relative opening 5; the panel 33 is made fast to the relative blocks 8 and members 3 by way of removable screws 34 (see FIG. 1).

Referring now to FIG. 5, the single panel 33 is embodied as a plate 35 provided with a peripheral lip 36 disposed normal to the plane of the plate 35 and exhibiting a U-shaped cross section the hollow of which is disposed such as to offer a channel 37, around the full peripheral length of the plate 35, in which the mounting 31 and relative seal 32 may locate; the lip thus constitutes not only a part of the dustproof sealing means, but also, a means of aligning and affording support to the panel 33 when offered to the framework 2.

In the variation of FIG. 6, the seal 32 aforementioned is replaced by a seal, denoted 38, which exhibits a substantially S-shaped cross section and creates two channels occupying the full peripheral length of the seal itself, one of which engaged by the relative mounting 31, the other engaged by the peripheral lip 39 of the panel 33.

The variation of FIG. 7 is identical to that of FIG. 6, with the sole difference that the seal 38 is split into two parts—viz, one U-shaped seal 32 engaging the mounting 31, and a further seal 40 of similar U shape engaging the rib 29.

The variation of FIG. 8 is identical to that of FIG. 5, with the sole difference that the seal 32 aforementioned is replaced by a seal 41 exhibiting a cross section composed of a first U-shaped part 42, which engages the mounting 31, and a second part 43 embodied in deformable elastomer material, which is accommodated by the channel 37.

The variation of FIG. 9 is identical to that of FIG. 6, with the sole difference that the seal 38 aforementioned is replaced by the seal denoted 41, and the panel lip 39 urges directly against the part denoted 43 which, deforming under frontally applied pressure, embraces the lip 39 and ensures the dust-proof join between the panel 33 and the relative frame 6.

It will be observed (FIG. 2) that the ribs 30 may all project from their respective surfaces 21, or alternatively, at least one rib may be set back from the relative surface 21 in order to enable fitment of the relative panel 33 such that its plate 35 remains flush with the surface 21. In this latter instance, the contoured rib 30 will be integral with the surface of a plate 44 projecting sideways from the block 8 in a position set back from the relative surface 21 and parallel therewith, and the rib 29 of each member 3 adjoining a contoured rib 30 thus embodied will project from the surface of a fin 45 made integral with the member 3 at a point mid-way across the relative lateral surface 27.

It will be observed from FIG. 3 that a single intermediate joint 7 exhibits four appendages 10, two of which, coaxially disposed, engage members 3 extending along one of the edges of the framework 2, and the remaining two, disposed at right angles to one another in a plane perpendicular to the axis of the two coaxial appendages, engage dividing members 46 located between adjacent openings 5 lying within the same plane; such members 46 are identical to the members 3 first mentioned, with the sole difference that their two lateral fins 28 lie within the same plane, and the two longitudinal ribs 29 are disposed alongside and parallel with one another. Similarly, the block 8 of each intermediate joint 7 exhibits two outer surfaces 21 both having two contoured ribs 30, each of which interconnects the rib 29 of one member 3 with the rib 29 of a dividing member 46.

In order to permit of fitting screws 17 (see FIG. 4) the block 8 of each intermediate joint 7 is provided with an internal recess 47 inaccessible from the outside by removing a cap (not illustrated).

Figure 10:
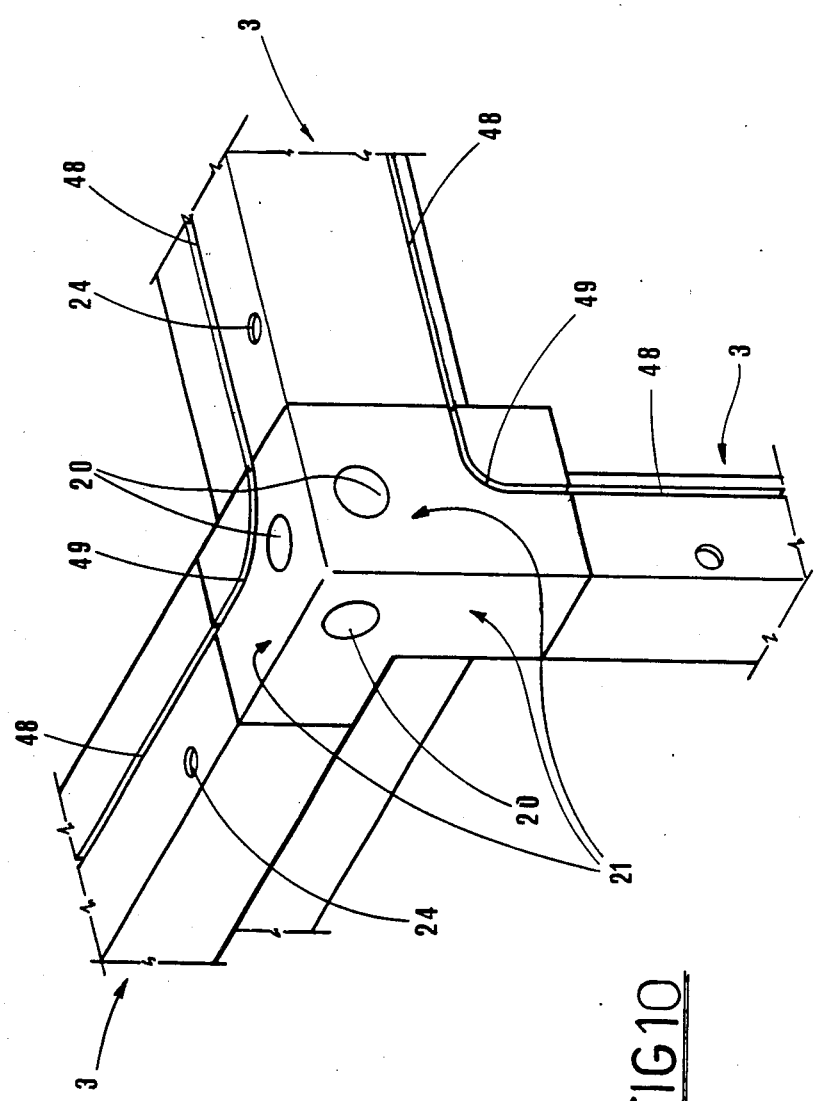
FIG. 10 is the perspective of a variation on the detail of FIG. 2.

In the embodiment of FIG. 10, ribs 29 and 30 are replaced by straight and contoured channels 48 and 49, respectively, which extend the length of the members 3 and 46, and along the surfaces 21, and are engaged (see FIG. 11) by part 50 of a seal 51 that occupies the full peripheral length of the relative frame 6 and comprises a part 52 projecting outwardly from the relative channels 48 and 49, thus providing the means by which the panel 33 is frontally sealed, supported and aligned relative to the framework 2.

A further embodiment illustrated in FIG. 12 incorporates appendages 10 each plug 11 of which is provided with a longitudinal, central slit 53 that divides the plug into two equal halves 111 and 112; in this embodiment; spreading means (see also FIG. 13) take the form of wedge inserts 54 the tapered ends of which are located between the two halves 111 and 112 of a plug 11 and the web 15 of the relative member 3; each insert 54 is provided with a threaded hole 57 that accomodates a screw 58 passing through a hole 55 in the block 8 of the joint. The surface of each insert 54 that slides against the web 15 of the member 3 will be disposed parallel, preferably, to the axis of the threaded hole 57; accordingly, each such surface is provided with a longitudinal groove 56 (see FIG. 12) matching the profile of the bead 16 offered by the web 15. On the other hand, those surfaces making sliding contact with the two halves 111 and 112 of the relative plug 11 will be angled in relation thereto, enlarging ultimately to dimensions marginally greater than those of the passage 12 of the appendage 10 in which the web 15 is accommodated. Wedge inserts 54 of the kind can be employed equally well even with one-piece plugs 11 as shown in FIG. 2; in this particular instance, one surface only of the single insert 54 will be angled in relation to the axis of its threaded hole 57, to be precise, that opposite the surface exhibiting the longitudinal groove 56.

What is claimed:

1. A dustproof cabinet for electrical equipment or the like comprising:

a framework of substantially parallelepiped shape including a plurality of outwardly facing openings each substantially in the shape of a parallelogram;

said framework including a plurality of joints and members with each joint having means for detachable interconnection with a plurality of said members so as to form said framework, each joint being located in the framework at a vertex of at least three of said openings;

said cabinet further including fastener means for securing each said member removably and detachably in a respective joint;

a plurality of panels each for mounting over a said opening, said members and joints when assembled providing for each said opening a peripheral frontal abutment for receiving a said panel;

a mounting means extending continuously about the periphery of each said opening and carried by said members and joints so as to provide support for sealing means; and dustproof sealing means removably lodged between each said panel and said framework and engaging the entire periphery of each said panel with said respective mounting means, preventing outward movement of said respective sealing means with respect of a said panel.

2. Cabinet as in claim 1, each joint of which comprises a central block, and each member of which is embodied hollow, wherein the means of interconnection for each member comprises an appendage that projects from a relative surface of the block and engages in the end of a member.

3. Cabinet as in claim 1, wherein the mounting provided around each opening affords support to the respective sealing means located similarly around each opening, and comprises straight sections extending the length of those members which surround the opening, and contoured sections interconnecting the straight sections and extending across the surfaces of the joints which interconnect the members.

4. Cabinet as in claim 3, wherein at least one panel is fitted proud of a relative frontal surface of the framework, and the relative mounting accordingly occupies the full peripheral length of such a frontal surface.

5. Cabinet as in claim 3, wherein at least one panel is fitted substantially flush with a respective frontal surface of the framework, and the relative mounting means accordingly occupies the full peripheral length of a surface of the framework which is set back from such a frontal surface.

6. Cabinet as in claim 3, wherein the mounting means comprises a rib projecting from the framework toward the respective panel.

7. Cabinet as in claim 3, wherein the mounting means comprises a channel occupying the peripheral length of the surface of a single frame to which a respective panel is offered, and wherein sealing means engage in such a channel and project therefrom toward the respective panel.

8. Cabinet as in claim 1, wherein each panel comprises a plate, and a lip projecting perpendicularly from the plate around its periphery, and wherein the mounting means surrounding each opening is paired with the lip of the respective panel in order to align the panel with the framework in relation to the opening.

9. A dustproof cabinet for electrical equipment or the like comprising:

a framework of substantially parallelepiped shape including a plurality of outwardly facing openings each substantially in the shape of a parallelogram;

said framework including a plurality of joints and members with each joint having means for detachable interconnection with a plurality of said members so as to form said framework, each joint being located in the framework at a vertex of at least three of said openings;

said cabinet further including fastener means for securing each said member removably and detachably in a respective joint;

a plurality of panels each for mounting over a said opening, said members and joints when assembled providing for each said opening a peripheral frontal abutment for receiving a said panel;

a mounting means extending continuously about the periphery of each said opening and carried by said members and joints so as to provide support for sealing means;

dustproof sealing means removably lodged between each said panel and said framework and engaging the entire periphery of each said panel with said respective mounting means preventing outward movement of said respective sealing means with respect of a said panel; each joint comprising a central block, each member being hollow, said means for detachable interconnection comprising an appendage that projects from a surface of said block and engages in a said member, each appendage comprising a pair of plugs located side by side, and said cabinet further including a removable fastener associated with each appendage and constituting spreading means adapted to distance one plug from the other inside a said member, said two plugs being separated from one another by a slot and each member having an internal transverse web engaging slidably in a said slot, the removable fasteners for each member further comprising an axial fastener passing through the central block and engaging axially in the transverse web.

10. Cabinet as in claim 9, wherein each plug is provided with a longitudinal, central slit dividing the plug into two equal and symmetrically-disposed halves, and wherein removable fasteners operate in conjunction with spreading means, associated with each plug, to the end of distancing the two halves one from the other inside the relative member.

11. Cabinet as in claim 9, wherein each plug of the pair exhibits a U profile when seen in cross section, and the hollow sides of the two plugs are disposed facing one another, and wherein spreading means take the form of single wedge inserts located in the U profile of the single plugs such that the thick end of each wedge lies beyond the projecting end of the respective plug.

* * * * *